(12) United States Patent
Tokutomi et al.

(10) Patent No.: US 11,699,499 B2
(45) Date of Patent: Jul. 11, 2023

(54) MEMORY SYSTEM INCLUDING PARITIES WRITTEN TO DUMMY MEMORY CELL GROUPS

(71) Applicant: KIOXIA CORPORATION, Tokyo (JP)

(72) Inventors: Tsukasa Tokutomi, Kamakura Kanagawa (JP); Kiwamu Watanabe, Kawasaki Kanagawa (JP); Riki Suzuki, Yokohama Kanagawa (JP); Toshikatsu Hida, Yokohama Kanagawa (JP); Takahiro Onagi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/187,705

(22) Filed: Feb. 26, 2021

(65) Prior Publication Data
US 2022/0076773 A1  Mar. 10, 2022

(30) Foreign Application Priority Data

Sep. 7, 2020 (JP) ................ 2020-149839

(51) Int. Cl.
| G11C 29/42 | (2006.01) |
| G11C 29/24 | (2006.01) |
| G11C 29/44 | (2006.01) |
| G11C 29/12 | (2006.01) |

(52) U.S. Cl.
CPC ............ G11C 29/42 (2013.01); G11C 29/24 (2013.01); G11C 29/44 (2013.01); *G11C 2029/1202* (2013.01)

(58) Field of Classification Search
None
See application file for complete search history.

(56) References Cited

U.S. PATENT DOCUMENTS

| 7,630,261 | B2 | 12/2009 | Abe et al. |
| 9,934,858 | B2 | 4/2018 | Yang et al. |
| 10,013,308 | B2 | 7/2018 | Park et al. |
| 2005/0180213 | A1* | 8/2005 | Abe ............... G11C 16/0483 365/185.17 |
| 2014/0075259 | A1* | 3/2014 | Tam ............... G06F 11/1044 714/E11.053 |
| 2016/0322108 | A1* | 11/2016 | Yang ............... G11C 16/10 |
| 2018/0004601 | A1* | 1/2018 | Lee ............... H03M 13/2707 |

FOREIGN PATENT DOCUMENTS

JP  2005235260 A  9/2005

* cited by examiner

*Primary Examiner* — J. H. Hur
(74) *Attorney, Agent, or Firm* — Kim & Stewart LLP

(57) ABSTRACT

According to one embodiment, a memory system includes a memory controller and a nonvolatile memory with multiple planes each provided with multiple word lines, memory cell groups, dummy word lines, and dummy memory cell groups. The memory controller writes data to a memory cell group connected to a corresponding word line of any of the planes, such that a plane to which k-th data are to be written is different from a plane to which (k+m−1)-th data are to be written, and writes the parities to any of the dummy memory cell groups. The combinations of the data used for generating the different parities are different from each other.

8 Claims, 15 Drawing Sheets

FIG. 5

| PHYSICAL WL | | PLANE P0 | PLANE P1 |
|---|---|---|---|
| UMH | WLDD0 | Dummy | Dummy |
| | WLDD1 | Dummy | Dummy |
| | WLDD2 | Dummy | Dummy |
| | WLDD3 | Dummy | Dummy |
| | WL95 | QLC | QLC |
| | WL94 | QLC | QLC |
| | WL49-WL93 | QLC | QLC |
| | WL48 | QLC | QLC |
| | WLDU | Dummy | Dummy |
| LMH | WLDL | Dummy | Dummy |
| | WL47 | QLC | QLC |
| | WL2-WL46 | QLC | QLC |
| | WL1 | QLC | QLC |
| | WL0 | QLC | QLC |
| | WLDS3 | SLC(XOR) | SLC(XOR) |
| | WLDS2 | SLC(XOR) | SLC(XOR) |
| | WLDS1 | SLC(XOR) | SLC(XOR) |
| | WLDS0 | SLC(XOR) | SLC(XOR) |

*FIG. 7*

| PHYSICAL WL | | PLANE P0 | PLANE P1 |
|---|---|---|---|
| UMH | WLDD0 | Dummy | Dummy |
| | WLDD1 | Dummy | Dummy |
| | WLDD2 | Dummy | Dummy |
| | WLDD3 | Dummy | Dummy |
| | WL95 | QLC | QLC |
| | WL94 | QLC | QLC |
| | WL49-WL93 | QLC | QLC |
| | WL48 | QLC | QLC |
| | WLDU | Dummy | Dummy |
| LMH | WLDL | Dummy | Dummy |
| | WL47 | QLC | QLC |
| | WL2-WL46 | QLC | QLC |
| | WL1 | QLC | QLC |
| | WL0 | QLC | QLC |
| | WLDS3 | SLC(XOR) | SLC(XOR) |
| | WLDS2 | Dummy | Dummy |
| | WLDS1 | Dummy | Dummy |
| | WLDS0 | Dummy | Dummy |

*FIG. 8*

| PHYSICAL WL | | PLANE P0 | PLANE P1 |
|---|---|---|---|
| UMH | WLDD0 | Dummy | Dummy |
| | WLDD1 | Dummy | Dummy |
| | WLDD2 | SLC(XOR) | SLC(XOR) |
| | WLDD3 | SLC(XOR) | SLC(XOR) |
| | WL95 | QLC | QLC |
| | WL94 | QLC | QLC |
| | WL49-WL93 | QLC | QLC |
| | WL48 | QLC | QLC |
| | WLDU | Dummy | Dummy |
| LMH | WLDL | Dummy | Dummy |
| | WL47 | QLC | QLC |
| | WL2-WL46 | QLC | QLC |
| | WL1 | QLC | QLC |
| | WL0 | QLC | QLC |
| | WLDS3 | SLC(XOR) | SLC(XOR) |
| | WLDS2 | SLC(XOR) | SLC(XOR) |
| | WLDS1 | Dummy | Dummy |
| | WLDS0 | Dummy | Dummy |

FIG. 11

Top row (left to right):

Table 1:
| 0 | 1 | 2 | 3 |
|---|---|---|---|
| 1 | 2 | 3 | 0 |
| 2 | 3 | 0 | 1 |
| 3 | 0 | 1 | 2 |

Table 2:
| 0 | 1 | 3 | 2 |
|---|---|---|---|
| 1 | 2 | 0 | 3 |
| 2 | 3 | 1 | 0 |
| 3 | 0 | 2 | 1 |

Table 3:
| 0 | 1 | 2 | 3 |
|---|---|---|---|
| 1 | 2 | 3 | 0 |
| 3 | 0 | 1 | 2 |
| 2 | 3 | 0 | 1 |

Bottom row (left to right):

Table 4:
| 0 | 1 | 2 | 3 |
|---|---|---|---|
| 3 | 0 | 1 | 2 |
| 2 | 3 | 0 | 1 |
| 1 | 2 | 3 | 0 |

Table 5:
| 0 | 1 | 2 | 3 |
|---|---|---|---|
| 3 | 0 | 1 | 2 |
| 1 | 2 | 3 | 0 |
| 2 | 3 | 0 | 1 |

Table 6:
| 0 | 1 | 3 | 2 |
|---|---|---|---|
| 1 | 2 | 0 | 3 |
| 3 | 0 | 2 | 1 |
| 2 | 3 | 1 | 0 |

MEMORY SYSTEM INCLUDING PARITIES WRITTEN TO DUMMY MEMORY CELL GROUPS

CROSS-REFERENCE TO RELATED APPLICATION(S)

This application is based upon and claims the benefit of priority from Japanese Patent Application No. 2020-149839, filed Sep. 7, 2020, the entire contents of which are incorporated herein by reference.

FIELD

Embodiments described herein relate generally to a memory system.

BACKGROUND

A memory system which includes a nonvolatile memory, such as a NAND type flash memory, is known. Furthermore, a technique has been proposed for such memory systems in which an error correction coding is performed for each logical block that is a unit in which multiple physical blocks are integrated.

There has also been an increasing demand for allowing a host device to directly manage a NAND control and a latency. However, in order to satisfy this demand, the error correction coding using a logical block can not be applied. Thus, it is desirable to implement an error correction coding in units which differ from logical blocks (a management unit) that is utilized by the host device so as to allow the host device to manage the data access.

BRIEF DESCRIPTION OF THE DRAWINGS

FIG. 5 is a view illustrating aspects related to a process of writing data and parities.

FIG. 7 is a view illustrating aspects related to a process of writing data and parities according to a second embodiment.

FIG. 8 is a view illustrating aspects related to a process of writing data and parities according to a third embodiment.

FIG. 11 is a view illustrating an example of correspondence patterns between data and XOR parities.

DETAILED DESCRIPTION

Embodiments provide a memory system with improvements in error correcting (and decoding) capabilities.

In general, according to one embodiment, a memory system includes a memory controller and a nonvolatile memory including m planes, each plane having n word lines, n memory cell groups, q dummy word lines, and q dummy memory cell groups. The memory controller writes i-th data to a memory cell group connected to an i-th word line of any of the m planes, such that a plane to which k-th data are to be written is different from a plane to which (k+m−1)-th data are to be written, and writes m total parities to any of the q dummy memory cell groups. The combinations of the 1-st to n-th data used for generating the 1-st to m-th parities are different from each other.

Hereinafter, certain example embodiments of a memory system according to the present disclosure will be described in detail with reference to the accompanying drawings.

First Embodiment

Figure 1:
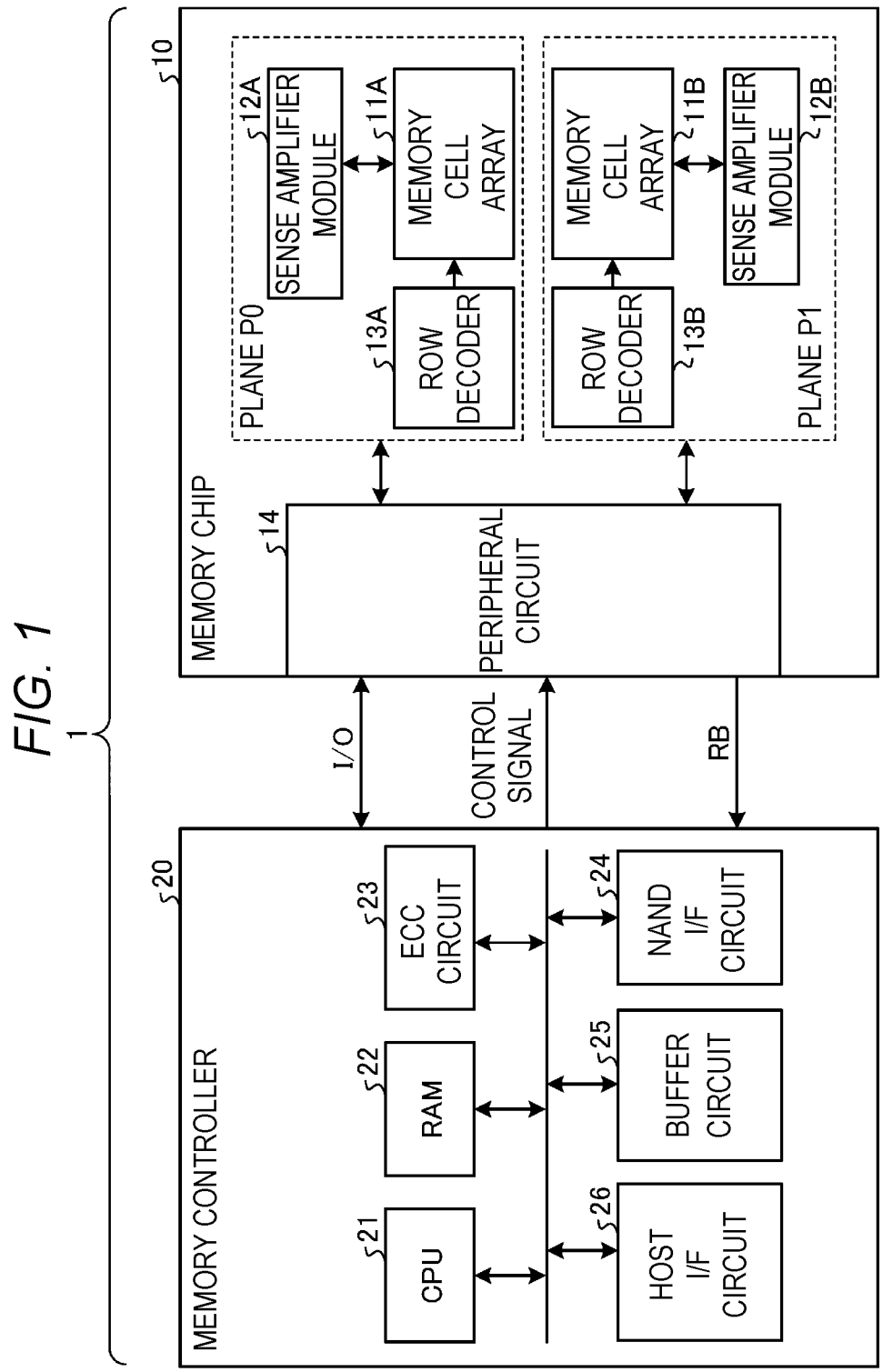
FIG. 1 is a schematic diagram of a memory system according to a first embodiment.

FIG. 1 is a schematic diagram illustrating an example of a configuration of a memory system 1 according to a first embodiment. The memory system 1 includes a memory chip 10 and a memory controller 20. In the example illustrated in FIG. 1, the memory system 1 includes one memory chip 10. The memory system 1 may include two or more memory chips 10.

The memory chip 10 is, for example, a NAND type flash memory that stores data in a nonvolatile manner. In the descriptions herein below, a case where a NAND type flash memory is used as the memory chip 10 will be described as an example. However, instead of the NAND type flash memory, a storage device such as another three-dimensional structure flash memory, a ReRAM (resistance random access memory), a FeRAM (ferroelectric random access memory) or the like may be used. Further, the memory chip 10 may not necessarily be a semiconductor memory, and the present embodiment may be applied to various storage media other than the semiconductor memory.

The memory chip 10 is provided with multiple planes that each include a memory cell array as an area where data are stored, and that are independently controllable. In the example of FIG. 1, the memory chip 10 includes two planes P0 and P1 as an example of the multiple planes. The number of planes is not limited to two, and may be three or more. The detailed configuration of the memory chip 10 will be described later.

The memory controller 20 instructs the memory chip 10 to perform reading, writing, erasing and others in response to a command from an external host device. The host device may be, for example, an electronic device such as a personal computer or a mobile terminal.

The memory controller 20 includes a CPU (central processing unit) 21, a RAM (random access memory) 22, an ECC (error checking and correcting) circuit 23, a NAND interface (I/F) circuit 24, a buffer memory 25, and a host interface (I/F) circuit 26.

The CPU 21 controls the entire operation of the memory controller 20 based on a firmware program.

The RAM 22 is a semiconductor memory such as a DRAM (dynamic random access memory), an SRAM (static random access memory) or the like, and is used as a work area of the CPU 21. The RAM 22 stores a firmware program for managing the memory chip 10, various management tables and others.

The ECC circuit 23 executes a data error correcting process. Specifically, the ECC circuit 23 generates an error correction code based on write data when data are written. Then, the ECC circuit 23 generates a syndrome from the error correction code when data are read, so as to detect an error and correct the detected error.

The NAND interface circuit 24 is connected to the memory chip 10 to communicate with the memory chip 10. For example, the NAND interface circuit 24 transmits/receives an input/output signal I/O with respect to the memory chip 10. Further, the NAND interface circuit 24 transmits various control signals to the memory chip 10, and receives a ready/busy signal RB from the memory chip 10. The signal RB is a signal for notifying the memory controller 20 of whether the memory chip 10 is in a ready or busy state. The ready state indicates a state where the memory chip 10 is able to receive a command from the memory controller 20. The busy state indicates a state where the memory chip 10 is unable to receive a command.

The buffer memory 25 temporarily stores data or the like that the memory controller 20 receives from the memory chip 10 and the host device.

The host interface circuit 26 can be connected to the host device via a host bus to communicate with the host device. For example, the host interface circuit 26 transmits a command and the data received from the host device to each of the CPU 21 and the buffer memory 25.

As illustrated in FIG. 1, the memory chip 10 includes the planes P0 and P1 and a peripheral circuit 14. The plane P0 includes a memory cell array 11A, a sense amplifier module 12A, and a row decoder 13A. The plane P1 includes a memory cell array 11B, a sense amplifier module 12B, and a row decoder 13B.

The memory cell arrays 11A and 11B may be collectively referred to as a memory cell array 11. The sense amplifier modules 12A and 12B may be collectively referred to as a sense amplifier module 12. The row decoders 13A and 13B may be collectively referred to as a row decoder 13.

Each of the memory cell arrays 11A and 11B includes nonvolatile memory cells each of which is associated with a bit line and a word line.

The sense amplifier modules 12A and 12B are provided corresponding to the memory cell arrays 11A and 11B, respectively. The sense amplifier module 12 reads data from the memory cell array 11, and outputs the read data to the memory controller 20. The sense amplifier module 12 transmits write data received from the memory controller 20, to the memory cell array 11. The sense amplifier module 12 includes data latches. The data latches are used for a data exchange with the peripheral circuit 14.

The row decoders 13A and 13B are provided corresponding to the memory cell arrays 11A and 11B, respectively. The row decoder 13 selects a word line that corresponds to memory cells subjected to a read operation and a write operation. Then, the row decoder 13 applies desired voltages to the selected word line and the other unselected word lines, respectively.

Each plane described above serves as a unit on which a read operation, a write operation, and an erase operation is independently executable. Specifically, the memory chip 10 may separately execute read operations, write operations, or erase operations on either one of the two planes. Furthermore, while executing the read operation, the write operation or the erase operation on either one of the two planes, the memory chip 10 may also execute a read operation, a write operation or an erase operation on the other plane. That is, the plane is the minimum unit on which the read operation, the write operation or the erase operation can be executed, and these operations may be executed for each plane separately or may be executed on multiple planes in parallel. The configuration of each plane is not limited to the configuration described above, though each plane includes at least a memory cell array 11.

Figure 2:
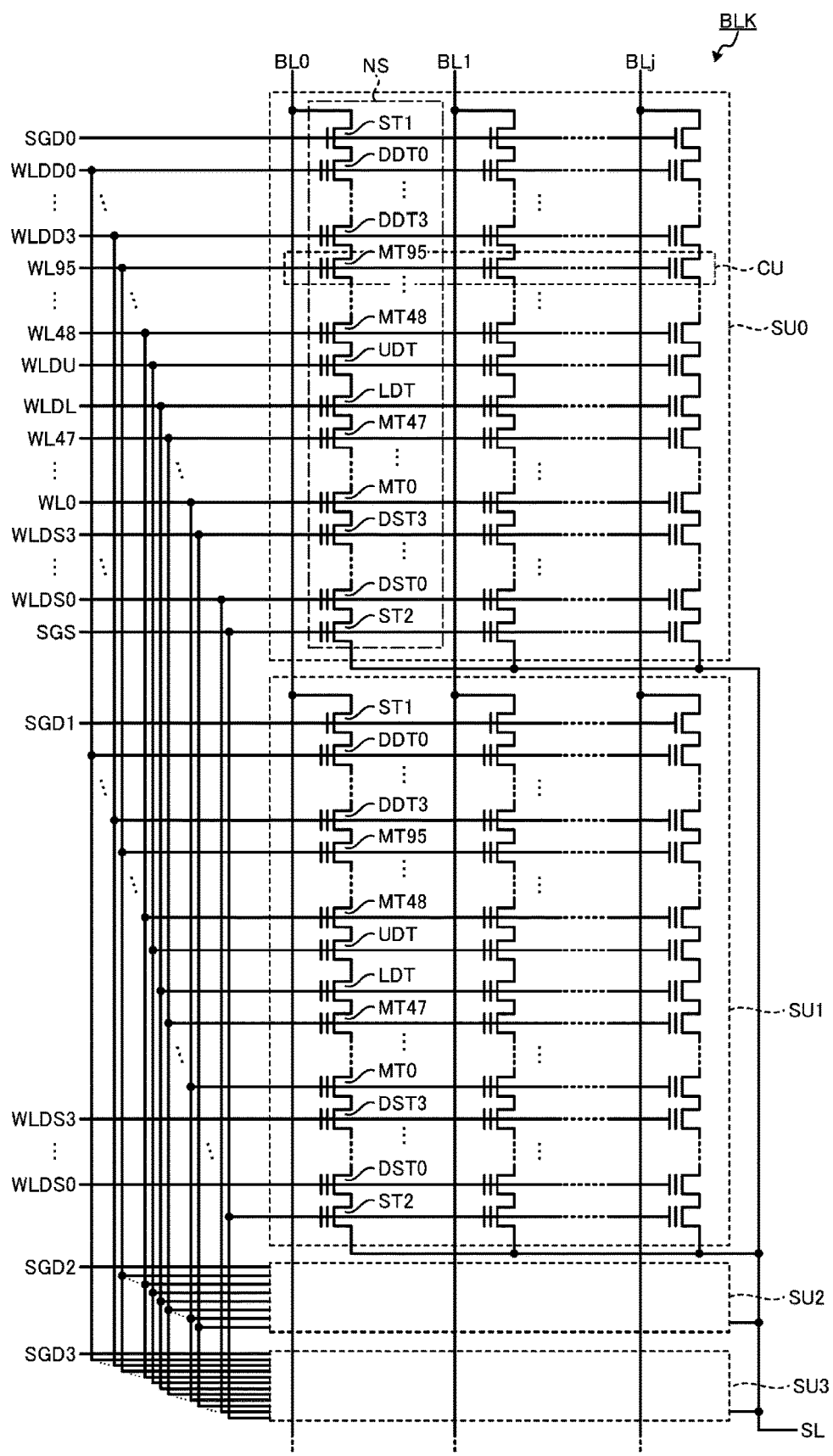
FIG. 2 depicts a circuit configuration of a memory cell array according to an embodiment.

Next, an example of a circuit configuration of memory cell array 11 will be described. FIG. 2 is a view illustrating an example of the circuit configuration of the memory cell array 11 according to the embodiment. The memory cell array 11 includes multiple blocks BLK, however, FIG. 2 depicts one block BLK extracted from the multiple blocks BLK of the memory cell array 11. As illustrated in FIG. 2, each block BLK includes, for example, four string units SU0 to SU3.

Each string unit SU0 to SU3 includes multiple NAND strings NS. The multiple NAND strings NS are each associated with one of the bit lines BL0 to BLj (where j is a natural number of 1 or more), respectively. Furthermore, each NAND string NS in this example includes dummy transistors DDT0 to DDT3, memory cell transistors MT0 to MT95, dummy transistors LDT and UDT, dummy transistors DST0 to DST3, and select transistors ST1 and ST2.

The dummy transistors DDT0 to DDT3, the dummy transistors LDT and UDT, and the dummy transistors DST0 to DST3 will be simply referred to as dummy transistors, when these transistors do not need to be separately identified for purposes of description. Likewise, the memory cell transistors MT0 to MT95 will be simply referred to as memory cell transistors MT, when these transistors do not need to be separately identified for purposes of description.

The number of string units SU in the block BLK is not limited to four. The number of memory cell transistors MT in one NAND string NS is not limited to 96.

Each memory cell transistor MT includes a control gate and a charge storage layer, and stores data in a nonvolatile manner. Each memory cell transistor MT is able to store one or more bits of data. The methods of storing 1-bit data, 2-bit data, 3-bit data, and 4-bit data are called SLC (single level cell), MLC (multi level cell), TLC (triple level cell), and QLC (quad level cell), respectively.

In the configuration described above, a grouping of 1-bit data stored in multiple memory cell transistors MT connected to a common word line WL in one string unit SU is called a "page". Accordingly, for example, when multiple bits of data are stored in each of the memory cell transistors MT, data that corresponding to multiple pages are stored in the group of the memory cell transistors MT connected to the same word line WL. The read operation and the write operation may be executed on each page separately. Alternatively, the read operation and the write operation may be executed for each word line.

In general, each dummy transistor has the same configuration as the memory cell transistors MT, and is essentially just a memory transistor that is not used for storing data but is provided primarily for the purpose of ensuring the reliability of the active (non-dummy) memory cell transistors MT. While it may not be desirable for a dummy transistor to store data of a QLC type, the dummy transistor may be allowed to store data of a SLC type, for example.

Both of the select transistors ST1 and ST2 are used for selecting a particular string unit SU when various operations are executed.

In each NAND string NS, the drain of the select transistor ST1 is connected to a corresponding bit line BL. The dummy transistors DDT0 to DDT3 and the memory cell transistors MT48 to MT95 are connected to each other in series between the source of the select transistor ST1 and the drain of the dummy transistor UDT. The source of the dummy transistor UDT is connected to the drain of the dummy transistor LDT. The memory cell transistors MT0 to MT47 and the dummy transistors DST0 to DST3 are connected to each other in series between the source of the dummy transistor LDT and the drain of the select transistor ST2.

Within the same block BLK, the control gates of the memory cell transistors MT0 to MT95 in the different NAND strings NS are connected in common to word lines WL0 to WL95, respectively. Similarly, the control gates of the dummy transistors DDT0 to DDT3 in each NAND string NS are connected in common to dummy word lines WLDD0 to WLDD3, respectively. The control gates of the dummy transistors UDT in the different NAND strings NS are connected in common to a dummy word line WLDU. The control gates of the dummy transistors LDT in the different NAND strings NS are connected in common to a dummy word line WLDL. The control gates of the dummy transistors DST0 to DST3 in the different NAND strings NS are connected in common to dummy word lines WLDS0 to WLDS3, respectively. The gates of the select transistors ST1 in different NAND strings NS within the respective string units SU0 to SU3 are connected in common to select gate lines SGD0 to SGD3, respectively. The gates of the select transistors ST2 are connected in common to a select gate line SGS.

Different column addresses are assigned to the bit lines BL0 to BLj, respectively, and each bit line BL connects the select transistors ST1 of a corresponding NAND strings NS throughout the multiple blocks BLK, in common. The word lines WL0 to WL95, and the dummy word lines WLDD0 to WLDD3, WLDU, WLDL, and WLDS0 to WLDS3 are provided for each block BLK. The source line SL is shared among the multiple blocks BLK.

Within one string unit SU, the multiple memory cell transistors MT connected to the same word line WL in common are referred to as a cell unit CU. The storage capacity of each cell unit CU changes according to the number of bits of data stored in the memory cell transistors MT. For example, the cell unit CU stores one-page data when each memory cell transistor MT stores one-bit data, and stores two-page data when each memory cell transistor MT stores two-bit data.

The cell unit CU is an example of a memory cell group. A cell unit CU that corresponds to dummy transistors connected to the same dummy word line in common may be referred to as a dummy memory cell group.

Figure 3:
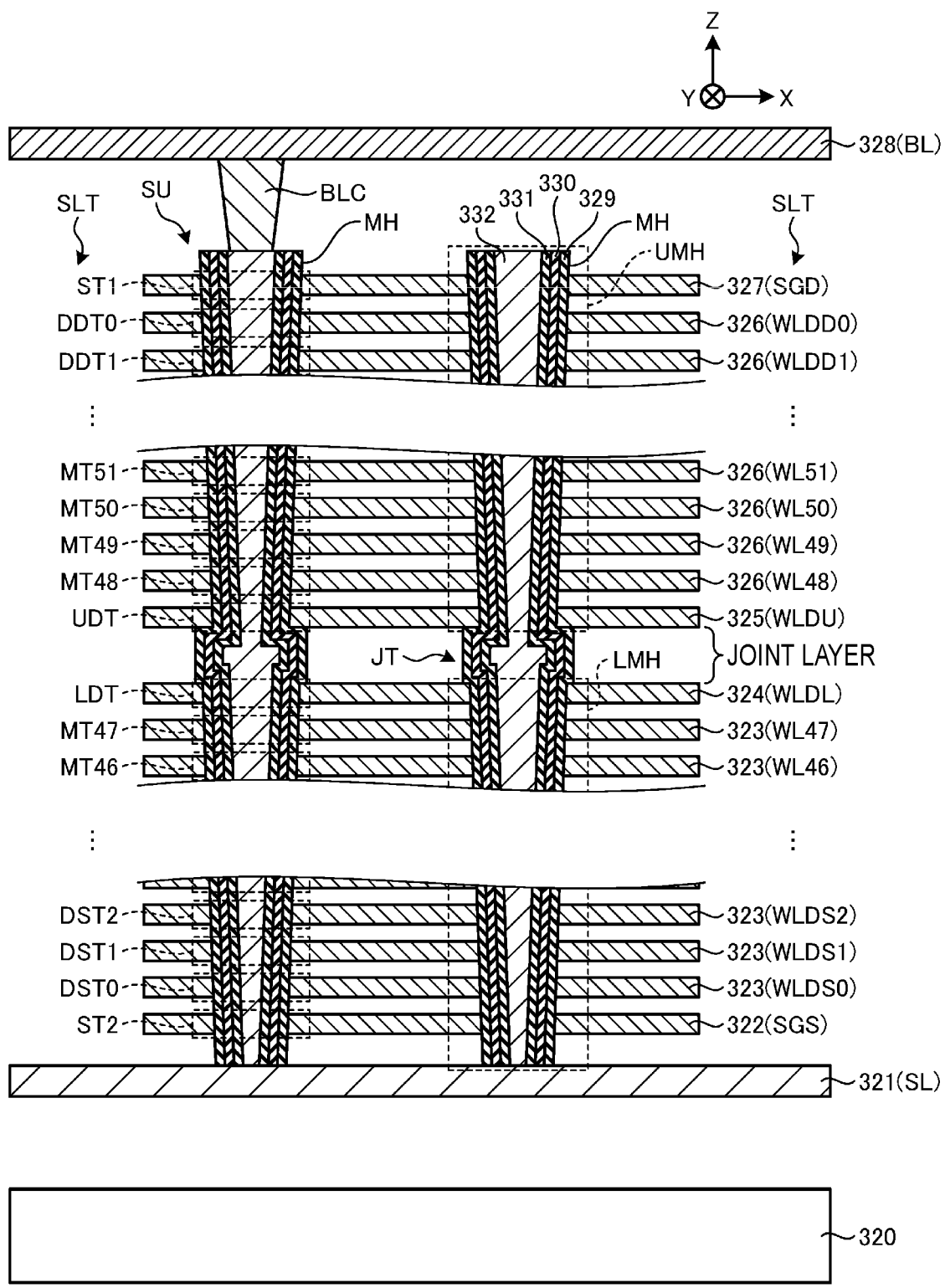
FIG. 3 depicts a cross-sectional structure of a memory cell array according to an embodiment.

Next, an example of a cross-sectional structure of the memory cell array 11 will be described. FIG. 3 is a view illustrating an example of the cross-sectional structure of the memory cell array 11 according to the embodiment. FIG. 3 represents the cross section of the memory cell array 11 while omitting interlayer insulating films, and represents an X-axis, a Y-axis, and a Z-axis. As illustrated in FIG. 3, the memory system. 1 includes a semiconductor substrate 320, conductors 321 to 328, memory pillars MH, and a contact plug BLC.

The surface of the semiconductor substrate 320 corresponds to the XY plane. The conductor 321 is provided above the semiconductor substrate 320 via an insulating film. The conductor 321 is formed in a plate shape along the XY plane, and functions as the source line SL. Multiple slits SLT are provided on the conductor 321 along the YZ plane, and arranged in the X direction. The structure above the conductor 321 between the adjacent slits SLT corresponds to, for example, one string unit SU.

Specifically, the conductor 322, the multiple conductors 323, the conductor 324, the conductor 325, the multiple conductors 326, and the conductor 327 are provided in this order from the lowermost layer above the conductor 321 between the adjacent slits SLT. Among the conductors, the conductors adjacent to each other in the Z direction are stacked via an interlayer insulating film. Each of the conductors 322 to 327 is formed in a plate shape along the XY plane.

In FIG. 3, the number of the multiple conductors 323 is 48, and the number of the multiple conductors 326 is 48, in accordance with FIG. 2. However, the number of the multiple conductors is not limited thereto. For the convenience of descriptions, FIG. 3 omits the conductors and others that correspond to the intermediate layers.

The conductor 322 functions as the select gate line SGS. The multiple conductors 323 function as the word lines WL0 to WL47, respectively, in an order from the lowermost layer. The conductors 324 and 325 function as the dummy word lines WLDL and WLDU, respectively. The multiple conductors 326 function as the word lines WL48 to WL95, respectively, in an order from the lowermost layer. The conductive layer 327 functions as the select gate line SGD.

The multiple memory pillars MH can be arranged in a staggered pattern, for example, in the Y direction, and each memory pillar MH functions as one NAND string NS. Each memory pillar MH passes through the conductors 322 to 327, so as to reach the upper surface of the conductor 321 from the upper surface of the conductor 327. Further, each memory pillar MH is provided in the form that multiple columns are connected to each other, and includes a lower pillar LMH, an upper pillar UMH, and a joint JT between the lower pillar LMH and the upper pillar UMH.

The upper pillar UMH is provided on the lower pillar LMH, and the lower pillar LMH and the upper pillar UMH are bonded to each other via the joint JT. For example, the outer diameter of the joint JT is larger than the outer diameter of the contact portion between the lower pillar LMH and the joint JT, and is larger than the outer diameter of the contact portion between the upper pillar UMH and the joint JT. The spacing of the joint layer where the joint JT is provided in the Z direction (e.g., the spacing between the conductors 324 and 325) is larger than the spacing between the adjacent conductors 323, and larger than the spacing between the adjacent conductors 326.

The memory pillar MH includes, for example, a block insulating film 329, an insulating film 330, a tunnel oxide film 331, and a conductive semiconductor material 332. The block insulating film 329 is provided on the inner wall of the memory hole that forms the memory pillar MH. The insulating film 330 is provided on the inner wall of the block insulating film 329, and functions as a charge storage layer of the memory cell transistor MT. The tunnel oxide film 331 is provided on the inner wall of the insulating film 330. The semiconductor material 332 is provided on the inner wall of the tunnel oxide film 331, such that a current path of the NAND string NS is formed inside the semiconductor material 332. The memory pillar MH may include a different material for the inner wall of the semiconductor material 332.

The portion where the memory pillar MH and the conductor 322 intersect each other functions as the select transistor ST2. The portions where the memory pillar MH and the multiple conductors 323 intersect each other function as the memory cell transistors MT0 to MT47, respectively, in an order from the lowermost layer. The portion where the memory pillar MH and the conductor 324 intersect each other functions as the dummy transistor LDT. As illustrated, each of the select transistor ST2, the memory cell transistors MT0 to MT47, and the dummy transistor LDT is formed by a portion through which the lower pillar LMH passes.

The portion where the memory pillar MH and the conductor 325 intersect each other functions as the dummy transistor UDT. The portions where the memory pillar MH and the multiple conductors 326 intersect each other function as the memory cell transistors MT48 to MT95, respectively, in an order from the lowermost layer. The portion where the memory pillar MH and the conductor 327 intersect each other functions as the select transistor ST1. As illustrated, each of the dummy transistor UDT, the memory cell transistors MT48 to MT95, and the select transistor ST1 is formed by a portion through which the upper pillar UMH passes.

The conductor 328 is provided above the upper surface of the memory pillar MH via an interlayer insulating film. The conductor 328 is formed in a line shape that extends in the X direction, and functions as a bit line BL. The multiple conductors 328 are arranged in the Y direction, and each conductor 328 is electrically connected to one corresponding memory pillar MH in each string unit SU. Specifically, in each string unit SU, a conductive contact plug BLC is provided on the semiconductor material 332 in the corresponding memory pillar MH, and one conductor 328 is provided on the contact plug BLC. The connection between the memory pillar MH and the conductor 328 may be implemented via multiple contact plugs, wirings or the like.

The configuration of the memory cell array 11 is not limited to the configuration described above. For example, the number of string units SU in each block BLK may be freely designed. The number of memory cell transistors MT, dummy transistors UDT and LDT, and select transistors ST1 and ST2 which are provided in each NAND string NS may also be freely selected.

The number of word lines WL, dummy word lines WLDU and WLDL, and select gate lines SGD and SGS may be changed based on the number of memory cell transistors MT, dummy transistors UDT and LDT, and select transistors ST1 and ST2, respectively. Multiple conductors 322 provided in multiple layers, respectively, may be assigned to the select gate line SGS, and multiple conductors 327 provided in multiple layers, respectively, may be assigned to the select gate line SGD.

FIG. 3 illustrates a configuration example in which the pillar PH is divided into a lower pillar LMH and an upper pillar UMH by the joint JT (that is, the pillar PH is a two-layer pillar in FIG. 3). However, the memory cell array 11 may include or comprise a single-layer pillar without including a joint JT.

Next, an example of an error correction code according to the present embodiment will be described. In the present embodiment, the ECC circuit 23 generates a multidimensional error correction code which is represented by a product code. The multidimensional error correction code refers to, for example, a code having a structure where each symbol, which is the unit that makes up an error correction code, is protected by multiple component codes in a multiple manner.

Hereinafter, a two-dimensional error correction code in which each symbol is protected by two component codes having different dimensions will be described as an example. The ECC circuit 23 generates, for example, a BCH (Bose-Chaudhuri-Hocquenghem) code and an LDPC (low-density parity-check) code as component codes in a page (component codes in the row direction). Further, the ECC circuit 23 generates XOR parities as component codes between pages (component codes in the column direction).

The error correction codes generated by the ECC circuit 23 are not limited to those described above. For example, the ECC circuit 23 may have a function of generating error correction codes that correspond to at least the XOR parities described above.

Next, a method of generating XOR parities will be described. The following configuration is assumed in this example. For the memory cell array 11 of FIG. 2, n=96, m=2, and l=10, and the following:

Number of word lines WL that correspond to memory cell transistors MT: n (where n is an integer of 2 or more)
Number of planes: m (where m is an integer of 2 to n)
Number of dummy word lines: p (where q is an integer of 1 or more)
An x-th memory cell group (where x is an integer of 1 to n) is connected to an x-th word line.
A w-th dummy memory cell group (where w is an integer of 1 to q) is connected to a w-th dummy word line.
One memory cell in a y-th memory cell group (where y is an integer of 1 to n), one memory cell in a (y+1)-th memory cell group, one memory cell in a z-th dummy memory cell group (where z is 1 or more and less than q), and each memory cell in a (z+1)-th dummy memory cell group are connected to each other in series.

Assuming the configuration described above, the ECC circuit 23 uses "n" total pieces of data (that is, 1-st to n-th individual pieces of data) to generate an "m" total pieces of parities (that is, 1-st to m-th individual parities).

The 1-st to n-th pieces of data are written to a memory cell connected to 1-st to n-th word lines, respectively. Furthermore, two pieces of data to be written to the word lines adjacent to each other are written to memory cells of different planes.

That is, the ECC circuit 23 generates "m" total pieces of parities by using the "n" pieces of data that satisfy the following conditions:

i-th data (where i is an integer of 1 to n) is written to multiple memory cells connected to an i-th word line in any plane.
The "m" planes from a plane that includes memory cells to which k-th data (where k is an integer of 1 to (n−m)) is to be written to a plane that includes memory cells to which (k+m−1)-th data is to be written are different from each other.
The combination of the 1-st to n-th data used for generating each of the 1-st to m-th parities differs among the 1-st to m-th parities.

Furthermore, the memory controller 20 writes the "m" pieces of parity data to the dummy memory cell groups, satisfying the following conditions:

The 1-st to m-th parities are written to any of the 1-st to q-th dummy memory cell groups in any plane.

Figure 4:
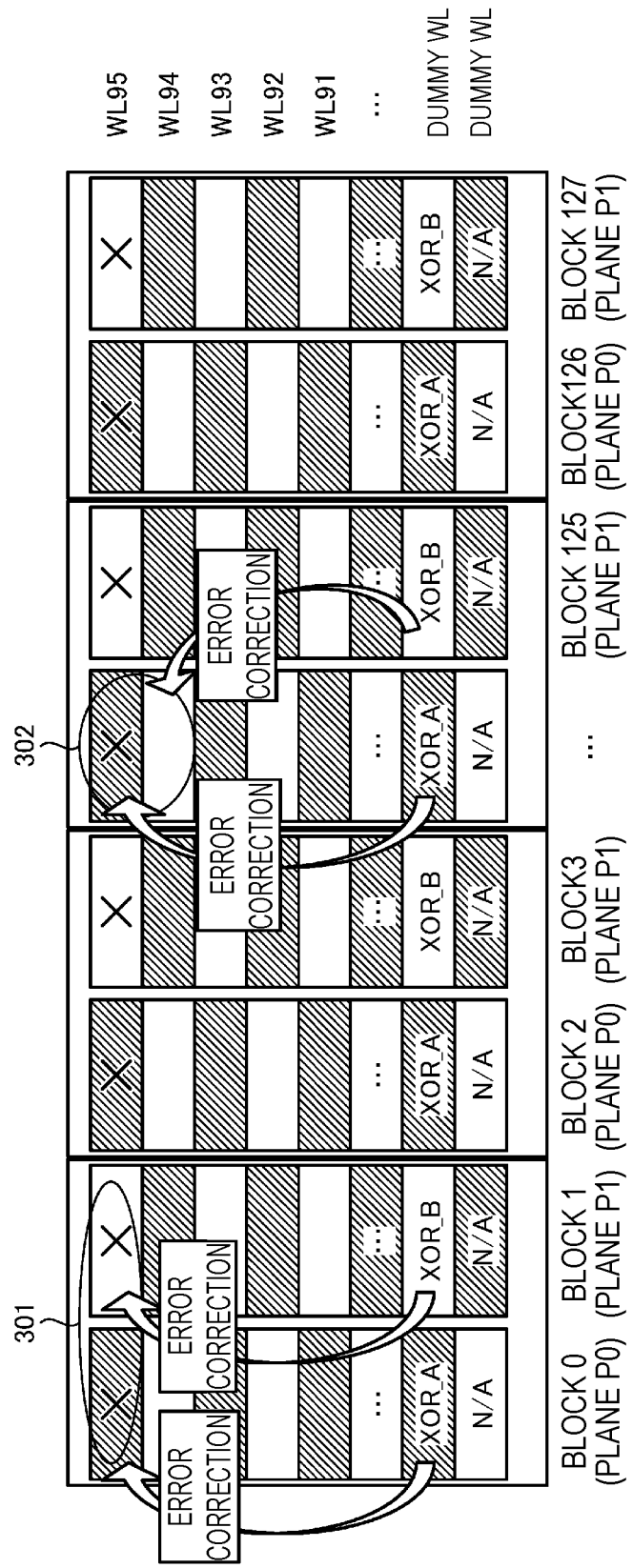
FIG. 4 is a conceptual diagram for explaining an example of a two-dimensional error correction code.

FIG. 4 is a conceptual view illustrating an example of the configuration of the two-dimensional error correction code. In FIG. 4, a set of two blocks corresponds to the management unit in which the host device manages the data access. One of the two blocks in each management unit is provided in the plane P0, and the other is provided in the plane P1. The rectangles in each block represent data or parities to be written. Further, while FIG. 4 illustrates an example where the total number of blocks is 128, the total number of blocks is not limited thereto.

In the example of FIG. 4, the number of planes is 2 (m=2), and the number of dummy word lines (dummies WL) is 2 (q=2). The two dummy word lines correspond to, for example, WLDS3 and WLDS2 in FIGS. 2 and 3. Parities are written to the dummy memory cell group that corresponds to one of the dummy word lines. Two parities (m=2), that is, Parities XOR_A and XOR_B are generated for each management unit.

When the number of planes is 2, the data used for generating the respective parities have a relationship in which the data change in an alternate manner between the two planes as illustrated in FIG. 4. Specifically, the parity XOR-A is generated from the data written to the memory cell groups connected to the odd-numbered word lines (odd-numbered WL) from the top of the plane P0, and the data written to the memory cell groups connected to the even-numbered word lines (even-numbered WL) from the top of the plane P1. The generated parity XOR_A is written to the dummy memory cell group connected to the dummy word line in the plane P0. Further, the parity XOR_B is generated from the remaining data. The generated parity XOR_B is written to the dummy memory cell group connected to the dummy word line in the plane P1.

The multiple parities are generated in this way, so that a correction (recovery) of lost, missing, or erroneous data may be performed using these parities, for example, data may be recovered even when the data of two planes of the same word line are lost (e.g., the data was erroneously written initially or was subsequently lost over time due to random effects or the like), or even when the data of two adjacent word lines are lost. Further, pattern 301 in FIG. 4 represents data of the two planes of the same word line being lost. Pattern 302 represents data of the two adjacent word lines are being lost.

Figure 6:
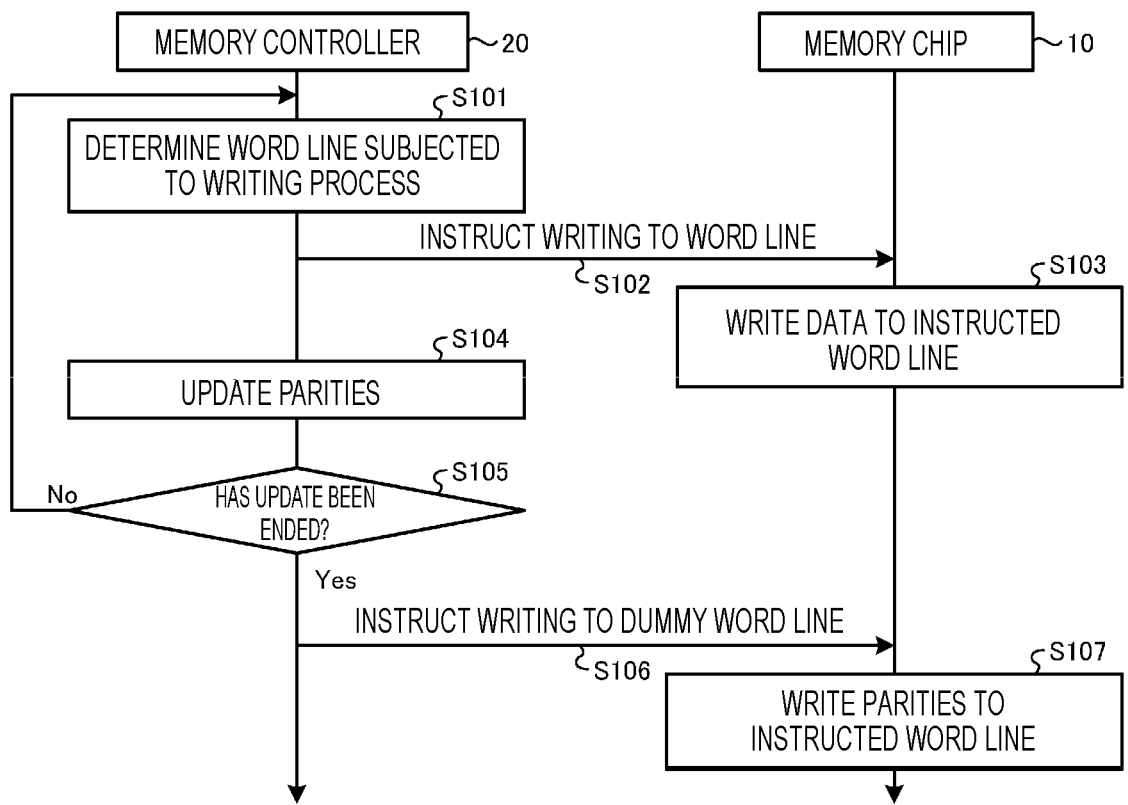
FIG. 6 depicts aspects related to a process sequence of a writing process.

FIG. 5 is a view illustrating an example of the flow of the process of writing data and parities. FIG. 6 is a sequence view illustrating an example of the writing process. In FIGS. 5 and 6, it is assumed that the memory controller 20 uses a writing method that performs a writing from the drain side toward the source side (in the direction of the arrows in FIGS. 5 and 6). The writing method may be a method that performs a writing from the source side toward the drain side.

In FIG. 5, the "QLC" label indicates that data is stored by a QLC method. The "SLC" label indicates that parities (XOR) are stored by a SLC method. The "Dummy" label indicates that no data is stored. In this way, a dummy memory cell group where no parity is stored may be provided. That is, memory cell groups and dummy memory cell groups may be configured as follows:

One memory cell in each of 1-st to e-th memory cell groups (where "e" is an integer of 2 to less than (n−1)) is connected in series to corresponding ones in the 1-st to e-th memory cell groups.

One memory cell in each of (e+1)-th to n-th memory cell groups is connected in series to corresponding ones in the (e+1)-th to n-th memory cell groups.

Each of the 1-st to m-th planes includes f-th to g-th dummy memory cell groups (where "f" is an integer larger than o, and "g" is an integer of "f" or more) that each include multiple memory cells.

One memory cell in the e-th memory cell group and one memory cell in the f-th dummy memory cell group are connected to each other in series.

One memory cell in the g-th dummy memory cell group and one memory cell in the (e+1)-th memory cell group are connected to each other in series.

No parity is written to the f-th to g-th dummy memory cells.

The flow of the writing process will be described with reference to FIG. 6. The memory controller 20 determines a word line subjected to the writing process (step S101). In the case of FIG. 5, the memory controller 20 determines the word line WL95 disposed closest to the drain side, to be a first writing process target word line.

The memory controller 20 instructs the memory chip 10 to write data using the determined word line (step S102). The memory chip 10 writes data to the memory cell group connected to the instructed word line (step S103). The memory controller 20 (more particularly, the ECC circuit 23 in this example) updates the XOR parities using the data instructed to be written (step S104). The ECC circuit 23 calculates, for example, calculated XOR parities and the XOR of the data instructed to be written, as new XOR parities.

The memory controller 20 uses a temporary storage unit such as the buffer memory 25, in order to temporarily store the XOR parities for each management unit.

The memory controller 20 determines whether the update of XOR parities has been ended (step S105). For example, the memory controller 20 determines whether the update of XOR parities has been ended, according to whether the writing of all data for the management unit has been ended. In the example of FIG. 5, the memory controller 20 determines that the update of XOR parities has been ended, when the writing of data is completed for WL95 to WL0 of the management unit that includes the planes P0 and P1.

When it is determined that the update has not been ended (step S105: No), the process returns to step S101, and the process is repeated for the next word line. When it is determined that the update has been ended (step S105: Yes), the memory controller 20 instructs the memory chip 10 to write the XOR parities using the dummy word lines (step S106). Since the XOR parities are written by the SLC, the memory controller 20 writes the four XOR parities to the dummy memory cell groups connected to WLDS3 to WLDS0 in an order. The memory chip 10 writes the data to the dummy memory cell groups connected to the instructed dummy word lines (step S107).

The memory controller 20 instructs the writing of the XOR parities by using a command such as, for example, a prefix command defined for the writing to the dummy memory cell groups.

For the writing method that performs a writing from the drain side toward the source side, the XOR parities are written in an order, to the dummy memory cell groups connected to the dummy word lines WLDS3 to WLDS0 close to the source side.

For the writing method that performs a writing from the source side toward the drain side, the XOR parities may be written in an order, to the dummy memory cell groups connected to the dummy word lines WLDD3 to WLDD30 close to the drain side.

When the number of dummy word lines is five or more, the dummy word lines to which the XOR parities are to be written may be freely selected. From the viewpoint of reliability, it is desirable to preferentially use dummy word lines close to a word line to which data are to be written (WL0 for the writing method that performs a writing from the drain side toward the source side).

In this way, in the memory system according to the first embodiment, the error correction coding may be implemented in units in which the host device manages the data access (the management unit). In the present embodiment, even when the data of the multiple planes of the same word line are lost, and even when the data of the two adjacent word lines are lost, the error correction using the parities is possible.

Second Embodiment

In the first embodiment, the four XOR parities that correspond to four pages stored by the QLC are stored. A memory system according to a second embodiment stores XOR parities that correspond to a portion of pages.

Since the configuration of the memory system of the second embodiment is similar to FIG. 1 described in the first embodiment, descriptions thereof will be omitted. FIG. 7 is a view illustrating an example of the flow of a process of writing data and parities in the second embodiment.

In the QLC, the 4-bit data stored in one memory cell transistor MT is called, for example, a top bit, an upper bit, a middle bit, and a lower bit. Further, a group of top bits in all memory cell transistors MT connected to the same word line is called a top page. A group of upper bits in all memory cell transistors MT connected to the same word line is called an upper page. A group of middle bits in all memory cell transistors MT connected to the same word line is called a middle page. A group of lower bits in all memory cell transistors MT connected to the same word line is called a lower page.

In the second embodiment, the memory controller 20 generates XOR parities that only correspond to, for example, the lower page, and writes the generated XOR parities to a dummy memory cell group connected to one dummy word line. As in the first embodiment, the dummy word line to which the XOR parities are to be written may be freely selected. From the viewpoint of reliability, it is desirable to preferentially use a dummy word line close to a word line to which data are to be written.

The page for which XOR parities are to be generated is not limited to the lower page, and may be determined according to an error assumed or the like. Further, the number of pages for which XOR parities are to be generated is not limited to one, and may be two or more.

From the viewpoint of reliability, it is assumed that the dummy memory cell group connected to the dummy word line uses the SLC. Thus, for XOR parities, the number of dummy memory cells (dummy word lines) necessary for writing the XOR parities increases, as compared with data stored by, for example, the QLC. However, it may not be said that dummy memory cell groups for writing all XOR parities can be secured. In the memory system according to the second embodiment, XOR parities are generated only for a portion of pages. Thus, it may be possible to reduce the number of parities, so as to reduce the area necessary for writing parities.

Third Embodiment

In the first and second embodiments, a dummy word line to be accessed after a word line to which data are to be written is determined to be a dummy word line to which XOR parities are to be written, in consideration of a writing order determined by a writing method to be adopted. In a memory system according to a third embodiment, XOR parities may also be written to a dummy word line to be accessed before a word line to which data are to be written.

The XOR parities are not completed unless all write data that correspond to the management unit are provided. For example, in a writing method that performs a writing from the drain side toward the source side, it is necessary to write data from the drain side toward the source side. Accordingly, in the method of updating XOR parities while writing data to each word line as in the first and second embodiments, it is not possible to return to a dummy word line close to the drain side, and write XOR parities thereto after the update of XOR parities is ended.

Thus, in the third embodiment, dummy word lines close to the drain side may also be used as parity writing areas. Since the configuration of the memory system of the third embodiment is similar to FIG. 1 described in the first embodiment, descriptions thereof will be omitted. FIG. 8 is a view illustrating an example of the flow of a process of writing data and parities in the third embodiment.

In the third embodiment, data are temporarily backed up in a buffer until the update of XOR parities is ended. As the buffer, for example, an area or the like which is provided in the memory cell array 11 and is private to the host device can be used. The memory controller 20 stores data in the buffer by, for example, the SLC method. Hereinafter, such a buffer will be referred to as an SLC buffer. The memory controller 20 uses the SLC buffer as a buffer for data to be written to the memory chip 10. The memory controller 20 uses some blocks (or smaller units than blocks) or some memory cell groups of the memory chip 10 as the SLC buffer. The memory controller 20 stores the data written to the SLC buffer, in, for example, memory cell groups of the planes P0 and P1 by the QLC.

FIG. 8 illustrates an example where two XOR parities among the four XOR parities are written using the drain-side dummy word lines WLDD2 and WLDD3, and the other two XOR parities are written using the source-side dummy word lines WLDS3 and WLDS2. The combination of the dummy word lines used for writing the XOR parities is not limited thereto, and at least one or more drain-side dummy word lines may be used for writing the XOR parities. For example, the number of drain-side dummy word lines may be 1, 3 or 4. That is, the memory controller 20 may write a portion of the multiple generated XOR parities to, for example, 1-st to p-th drain-side dummy memory cell groups (p is an integer of 1 or more and less than q), and may write the other XOR parities to (p+1)-th source-side dummy memory cell groups.

Figure 9:
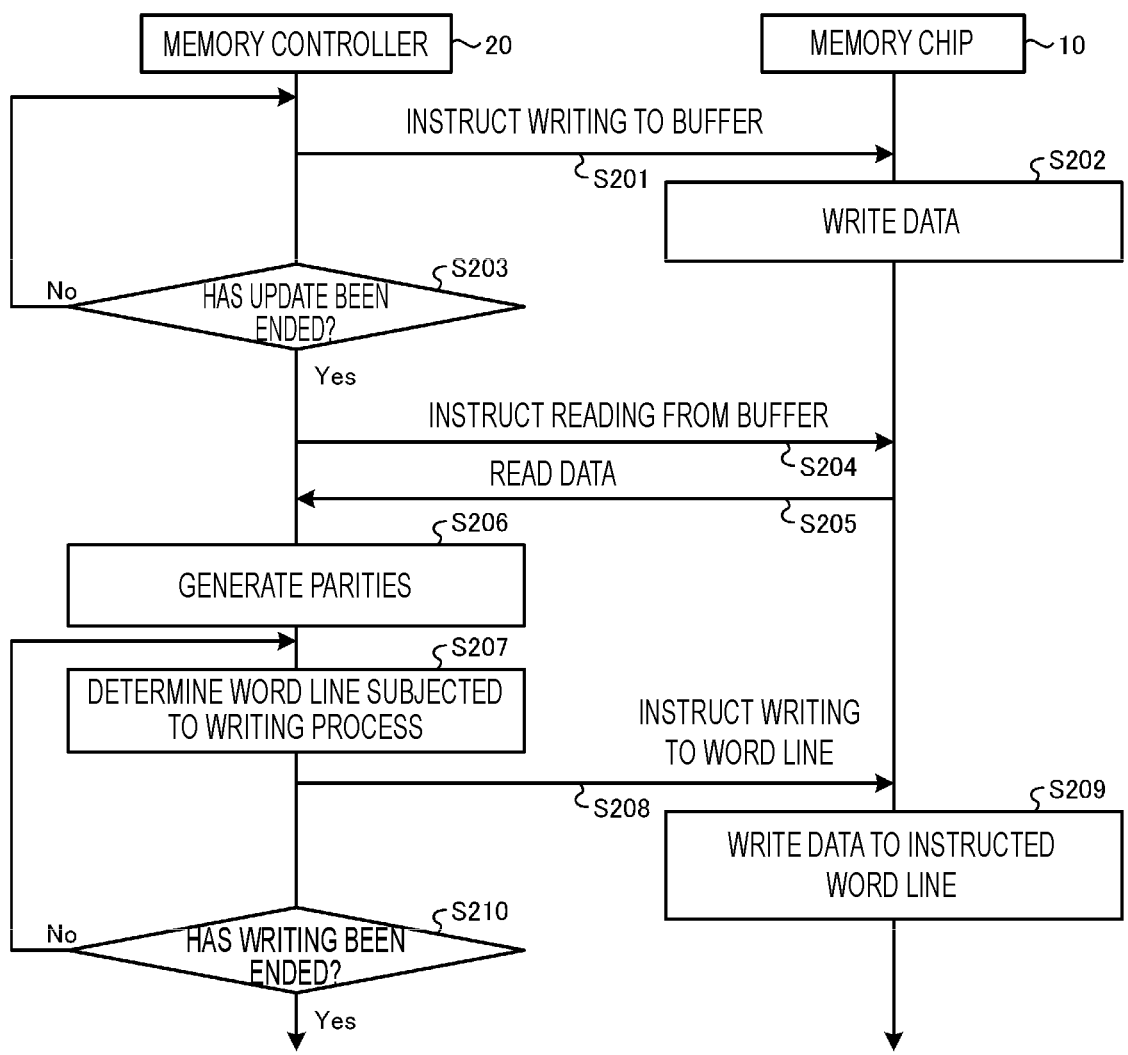
FIG. 9 depicts aspects related to a process sequence of a writing process according to a third embodiment.

FIG. 9 is a sequence view illustrating an example of the writing process in the third embodiment. In FIG. 9, it is assumed that the memory controller 20 uses the writing method that preforms a writing from the drain side toward the source side.

The memory controller 20 instructs the memory chip 10 to write data to the SLC buffer according to a command from the host device (step S201). The memory chip 10 writes data to the SLC buffer according to the instruction (step S202).

The memory controller 20 determines whether the writing of data has been ended (step S203). For example, the memory controller 20 determines that the writing has been ended, when data that correspond to the management unit are stored in the SLC buffer.

When it is determined that the writing has not been ended (step S203: No), the process returns to step S201, and the process is repeated for the remaining data. When it is determined that the writing has been ended (step S203: Yes), the memory controller 20 instructs to read the data from the SLC buffer (step S204). According to the instruction, the memory chip 10 reads the data stored in the SLC buffer for the corresponding management unit, and transmits the read data to the memory controller 20 (step S205).

The memory controller 20 (more particularly the ECC circuit 23 in this example) generates XOR parities by using the read data (step S206). Then, the memory controller 20 writes the data that correspond to the management unit, and the generated XOR parities in an order determined by the writing method that is applied.

That is, the memory controller 20 determines a word line subjected to the writing process (step S207). For example, in the case of FIG. 8, the memory controller 20 determines the dummy word line WLDD2 disposed closest to the drain side, to be a first writing process target word line.

The memory controller 20 instructs the memory chip 10 to write the data using the determined word line (step S208). The memory chip 10 writes the data to the memory cell group connected to the instructed word line (step S209).

The memory controller 20 determines whether the writing of data has been ended (step S210). For example, the memory controller 20 determines whether the writing of data has been ended, according to whether each of the writing of XOR parities using the drain-side dummy word line, the writing of the data read from the SLC buffer using a word line, and the writing of XOR parities using the source-side dummy word line has been ended. In the example of FIG. 8, the memory controller 20 determines that the writing of data has been ended, when the writing of the data and the XOR parities is completed for WLDD2 to WLDS2 of the management unit that includes the planes P0 and P1.

When it is determined that the writing has not ended (step S210: No), the process returns to step S207, and the process is repeated for the next word line. When it is determined that the writing has been ended (step S210: Yes), the sequence is ended.

Instead of the source-side dummy word lines WLDS2 and WLDS3, at least one of the dummy word lines WLDU and WLDL may be used.

As described above, in the memory system according to the third embodiment, XOR parities may be written to a dummy word line to be accessed before a word line to which data are to be written by the writing method that is applied. As a result, the writing area of the XOR parities may be increased, so that the range where the error correction is possible may be expanded.

(Modification 1)

A case where two planes (the planes P0 and P1) are provided has been described as an example. In Modification 1, a method of generating XOR parities when four planes P0, P1, P2, and P3 are provided will be described.

Figure 10:
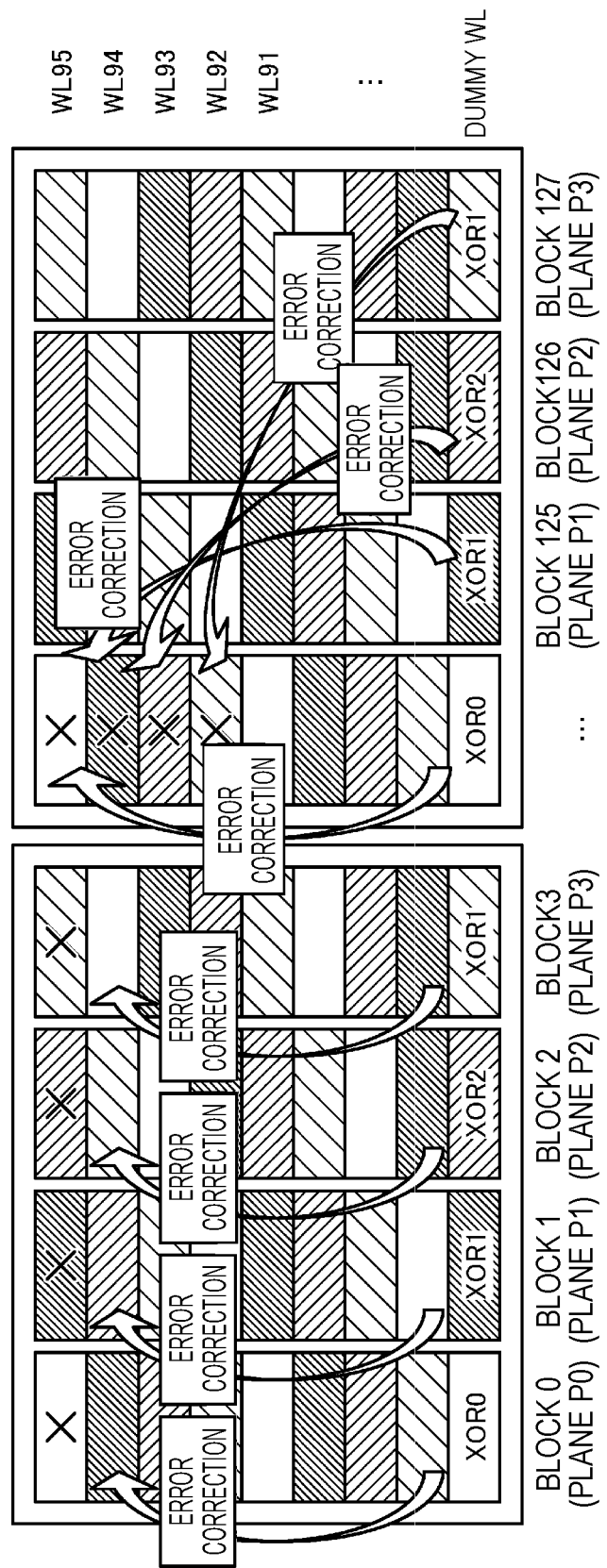
FIG. 10 is a conceptual diagram for explaining an example of a method of generating XOR parities according to Modification 1.

FIG. 10 is a view illustrating an example of a method of generating XOR parities in Modification 1. In FIG. 10, a set of four blocks corresponds to the management unit in which the host device manages the data access. The four planes P0, P1, P2, and P3 include four different blocks in each management unit, respectively. Further, while FIG. 10 illustrates an example where the total number of blocks is 128, the total number of blocks is not limited thereto.

In the example of FIG. 10, the number of planes is 4 (m=4), and the number of dummy word lines (dummies WL) is 1 (q=1). XOR parities are written to the dummy memory cell group that corresponds to the dummy word line. In the present modification, XOR parities that correspond to one page among the four pages stored by the QLC are stored, as in the second embodiment. Accordingly, four XOR parities XOR0 to XOR3 (m=4) are generated for each management unit.

FIG. 10 illustrates a case where multiple data that correspond to rectangles hatched identically to each XOR parity are used for generating the XOR parity. The correspondence between the data and the XOR parities illustrated in FIG. 10 is an example, and is not limited thereto. Any method may be used as long as the method generates the four parities using an "n" pieces of data that satisfy the conditions described above.

FIG. 11 is a view illustrating an example of correspondence patterns between data and XOR parities. While FIG. 11 illustrates the correspondence patterns for the four word lines, the correspondence patterns are repeated, for example, to be as many as the number of word lines. Each numerical value in FIG. 11 indicates an XOR parity generated using data, among the four XOR parities illustrated in FIG. 10. For example, the data that correspond to the numerical values 0 to 3 are used to generate XOR0 to XOR3, respectively. FIG. 11 illustrates the six correspondence patterns, as an example. The upper left correspondence pattern in FIG. 11 corresponds to the example of FIG. 10.

(Modification 2)

Figure 12:
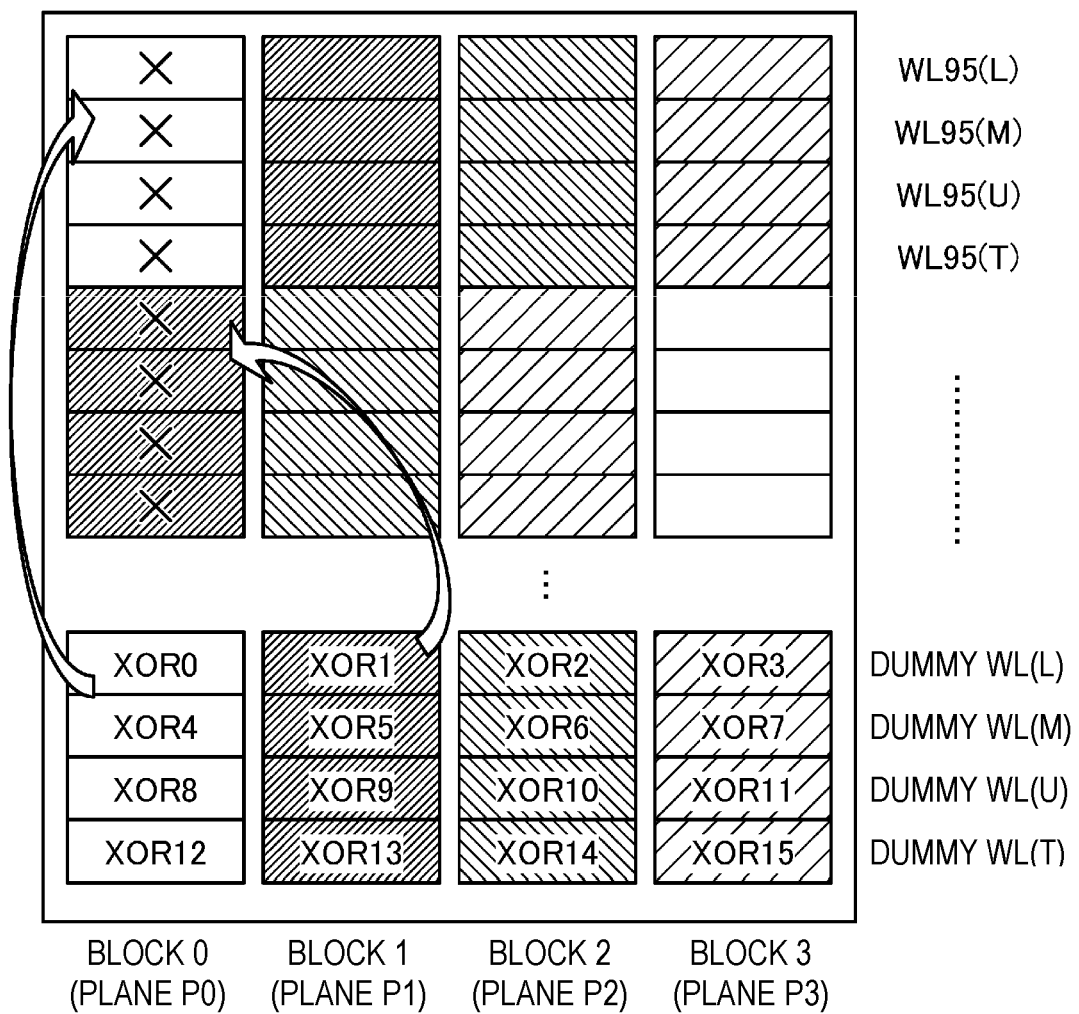
FIG. 12 is a conceptual diagram for explaining an example of a method of generating XOR parities according to Modification 2.

In Modification 2, descriptions will be made on an example where four planes P0, P1, P2, and P3 are provided, and four XOR parities that correspond to four pages stored by the QLC are stored. FIG. 12 is a view illustrating an example of the method of generating XOR parities in the present modification.

In the example of FIG. 12, the number of planes is 4 (m=4), and the number of dummy word lines (dummies WL) is 4 (q=4). XOR parities are written to the four dummy memory cell groups that correspond to the four dummy word lines, respectively. In the present modification, four XOR parities that correspond to the four pages stored by the QLC are stored, as in the first embodiment. Accordingly, 16 XOR parities XOR0 to XOR15 (=4 (number of planes)×4 (number of pages)) are generated for each management unit.

WL95(L), WL95(M), WL95(U), and WL95(T) correspond to the lower page, the middle page, the upper page, and the top page of the word line WL95, respectively. The same applies to the other word lines.

The dummies WL(L), WL(M), WL(U), and WL (T) correspond to the four dummy word lines, respectively, and are used for writing XOR parities generated from data of the lower page, the middle page, the upper page, and the top page of each word line.

For example, XOR0 to XOR3 are XOR parities generated from data of the lower page of each word line.

(Modification 3)

Each time data are written to any word line, the memory controller 20 may instruct the memory chip 10 to transmit a status that indicates the success or failure of the writing. Further, in a case where an error occurs when data are written to any word line of any block, the memory controller 20 may stop the writing to the block, and may back up all of the data to another block. In the present modification, descriptions will be made on an example where such a process is incorporated into the embodiments described above.

Figure 13:
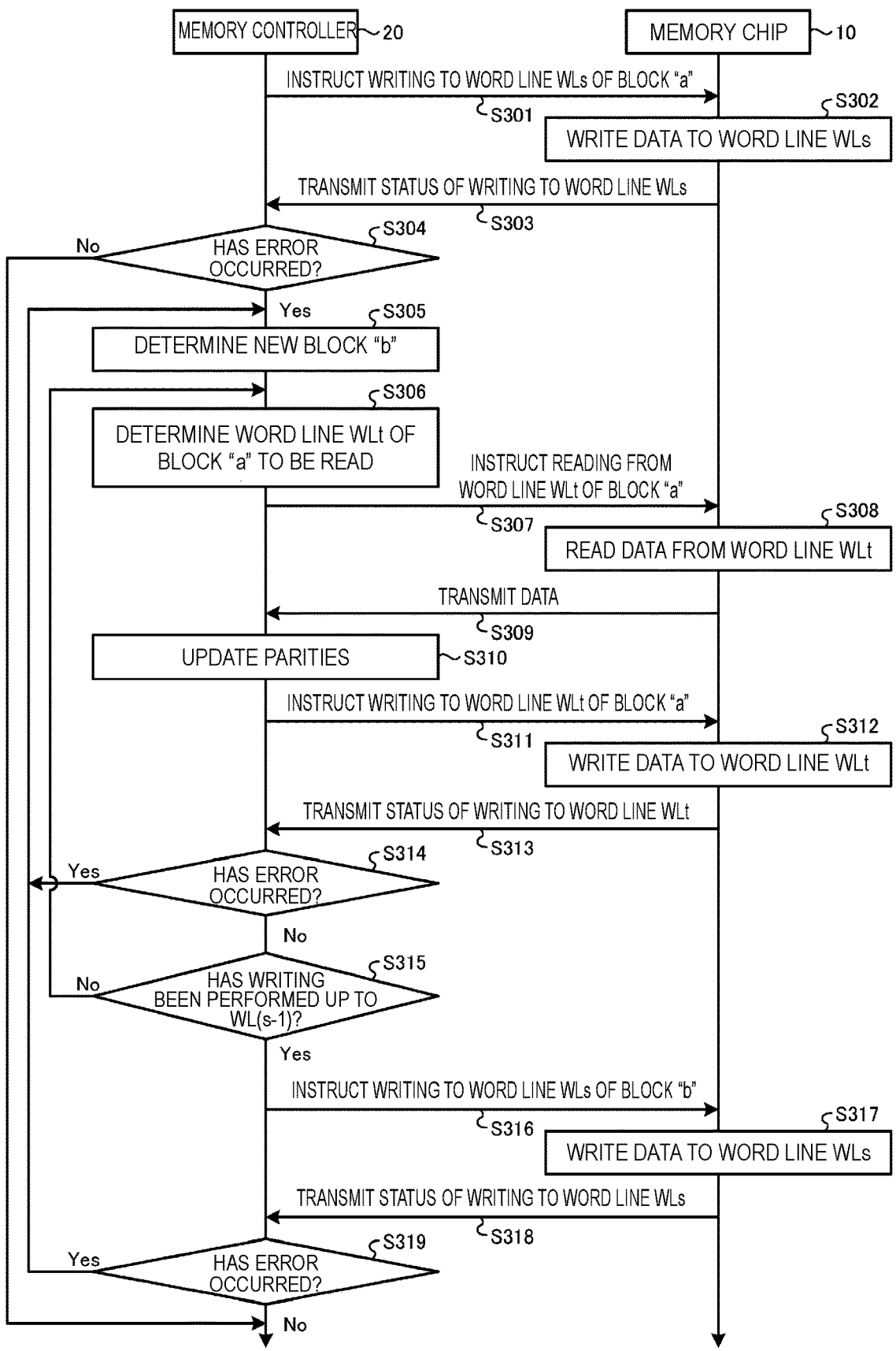
FIG. 13 depicts aspects related to a process sequence of a writing process according to Modification 3.

FIG. 13 is a sequence view illustrating an example of the writing process in the present modification. FIG. 13 represents the flow when data are written to a word line WLs of a certain block (referred to as a block "a") in the management unit.

The value "s" refers to a numerical value that indicates a position of a word line in each block, and takes a value of, for example, 0 to (n−1). Here, the value "n" refers to the number of word lines as described above. In the configuration illustrated in FIG. 2, "s" takes a value from 0 to 95 from the source side toward the drain side. In the descriptions herein below, the term "word line WLs" will be used to indicate a position of a word line for each block. For example, a word line WLs of a block "a" and a word line WLs of another block (referred to as a block "b") may be physically different from each other, but the position of the word line WLs is the same in the within the word lines of each block.

The memory controller 20 instructs the memory chip 10 to write the data using the word line WLs of the block "a", and to transmit the status of the writing (step S301). The memory chip 10 writes the data to the memory cell group connected to the word line WLs (step S302). The memory chip 10 transmits information indicating the status of the writing to the memory controller 20 (step S303).

The memory controller 20 determines whether an error has occurred in the writing, by using the received status (step S304). When it is determined that no error has occurred (step S304: No), it is regarded that the writing process for the word line WLs has been ended normally, and the next process is performed.

For example, when the present modification is combined with the first embodiment, step S104 and the subsequent steps in FIG. 6 are performed. When the present modification is combined with the second embodiment, step S210 and the subsequent steps in FIG. 9 are performed.

When it is determined that an error has occurred (step S304: Yes), the memory controller 20 determines a new block "b" for backing up the data (step S305). Further, when it is determined that an error has occurred, the memory controller 20 may store information indicating the occurrence of an error in the block "a".

In order to read the data to be backed up in the block "b", the memory controller 20 first determines a word line WLt of the block "a" to be read (step S306).

Similarly to the value "s" described above, the value "t" refers to a numerical value that indicates a position of a word line in each block, and takes a value of, for example, 0 to (n−1). Similarly to word line WLs described above, the term "word line WLt" will be used to indicate a position of a word line for each block. For the writing method that performs a writing from the drain side toward the source side, a word line to be read is determined in an order from the drain side toward the source side.

The memory controller 20 instructs the memory chip 10 to read the data from the word line WLt of the block "a" (step S307). The memory chip 10 reads the data from the memory cell group connected to the word line WLt (step S308), and transmits the read data to the memory controller 20 (step S309).

The memory controller 20 (more particularly, the ECC circuit 23 in this example) updates the XOR parities by using the received data (step S310). The ECC circuit 23 calculates the calculated XOR parities that are stored in, for example, the buffer memory 25 or the like, and the XOR of the received data, as new XOR parities. The update of XOR parities is performed for restoring the data that correspond to the word line WLs where an error has occurred.

The memory controller 20 instructs the memory chip 10 to write the received data using the word line WLt of the block "b", and to transmit the status of the writing (step S311).

The memory chip 10 writes the data to the memory cell group connected to the word line WLt (step S312). The memory chip 10 transmits information indicating the status of the writing to the memory controller 20 (step S313).

The memory controller 20 determines whether an error has occurred in the writing, by using the received status (step S314). When it is determined that no error has occurred (step S314: No), the memory controller 20 determines whether data have been written up to a word line WL(s−1) (step S315). When it is determined that the writing has not been performed (step S315: No), the process returns to step S306, and the process is repeated for the next word line.

When it is determined that data have been written up to the word line WL(s−1) (step S315: Yes), the memory controller 20 instructs the memory chip 10 to write the data using the word line WLs of the block "b" and transmit the status of the writing (step S316). At this time, the data instructed to be written are the data that correspond to the word line WLs and are restored by the repetition of the process of step S310.

The memory chip 10 writes the data to the memory cell group connected to the word line WLs (step S317). The memory chip 10 transmits information indicating the status of the writing to the memory controller 20 (step S318).

The memory controller 20 determines whether an error has occurred in the writing, by using the received status (step S319). When it is determined that no error has occurred (step S319: No), it is regarded that the writing process for the word line WLs has been ended normally, and the next process is performed.

When it is determined in steps S314 and 319 that an error has occurred (step S314: Yes, step S319: Yes), the memory controller 20 determines a new block "b" in order to back up the data in yet another block (step S305), and the same process as described above is repeated.

In the example described above, the data that correspond to the word line WLs where an error has occurred are restored using XOR parities. However, when the data that correspond to the word line WLs remains in, for example, the buffer memory 25, the data in the buffer memory 25 may be read and used for the writing.

(Modification 4)

Figure 14:
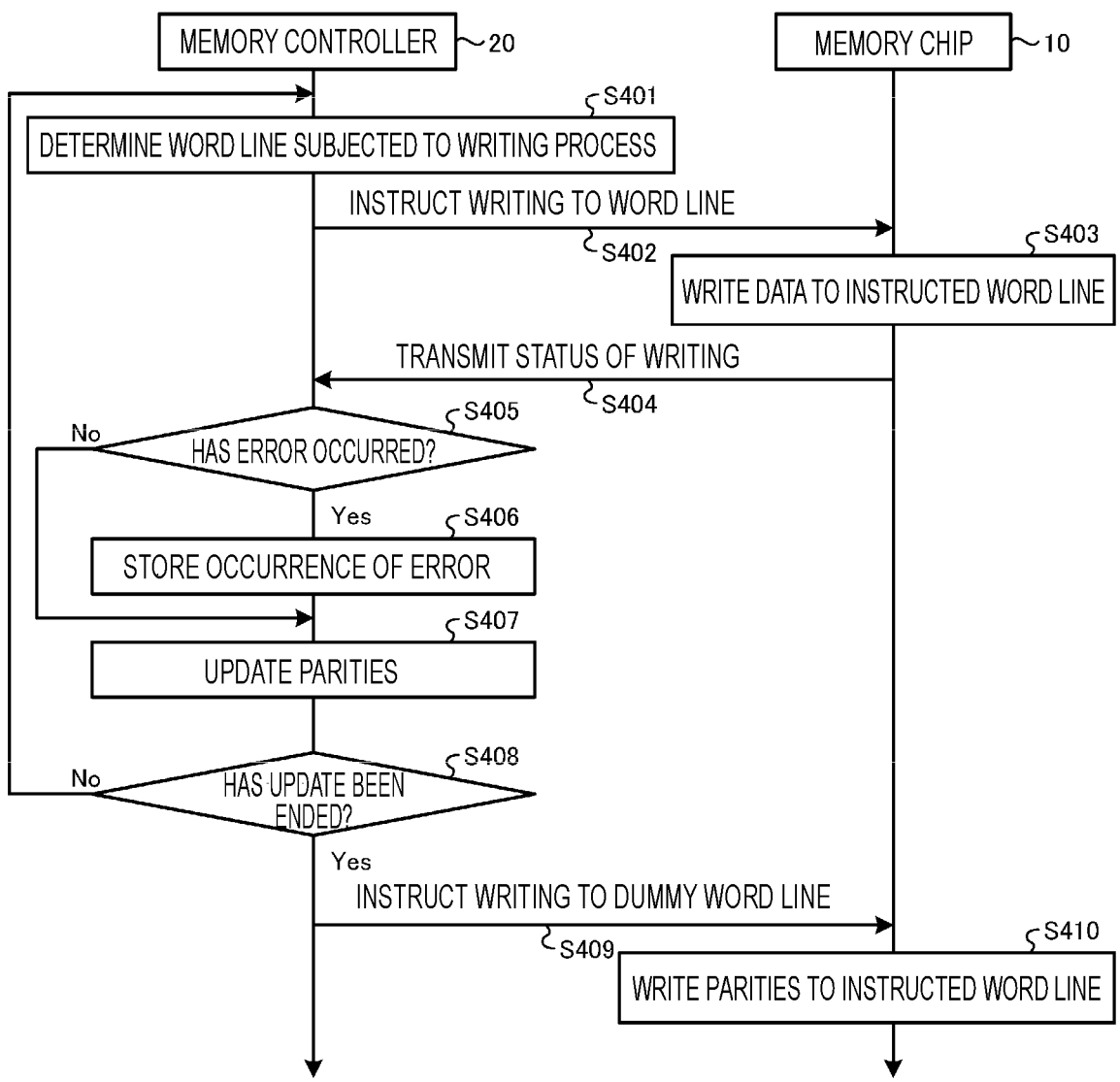
FIG. 14 depicts aspects related to a process sequence of a writing process according to Modification 4.

In the configuration in which data are backed up at the time when an error occurs as in Modification 3, the writing of next data may not be started until the process is ended, and as a result, the writing performance may be deteriorated. Thus, in the present modification, when an error occurs, information indicating the occurrence of an error is stored, and the process is continued without backing up the data. FIG. 14 is a sequence view illustrating an example of the writing process in the present modification.

The memory controller 20 determines a word line subjected to the writing process (step S401). The memory controller 20 instructs the memory chip 10 to write data using the determined word line, and transmit the status of the writing (step S402). The memory chip 10 writes the data to the memory cell group connected to the instructed word line (step S403). The memory chip 10 transmits information indicating the status of the writing to the memory controller 20 (step S404).

The memory controller 20 determines whether an error has occurred in the writing, by using the received status (step S405). When it is determined that an error has occurred (step S405: Yes), the memory controller 20 stores information indicating the occurrence of an error in the block subjected to the writing process (step S406).

After the information is stored, or when it is determined that no error has occurred (step S405: No), the memory controller 20 (the ECC circuit 23) updates the XOR parities by using the data instructed to be written (step S407).

Since steps S408 to S410 are the same as steps S105 to S107 of FIG. 6, description thereof will be omitted.

The information indicating the occurrence of an error may be used in other data relieving processes such as a garbage collection (compaction), a refresh process or the like. In such a relieving process, for example, a process of restoring data of a block for which information indicating the occurrence of an error is stored, and backing up the data in another block is performed. For example, when an error occurs in one word line, the data may be restored using XOR parities.

The relieving process may be performed as a background process that does not affect the data writing process. Accordingly, the deterioration in writing performance may be prevented.

(Modification 5)

Figure 15:
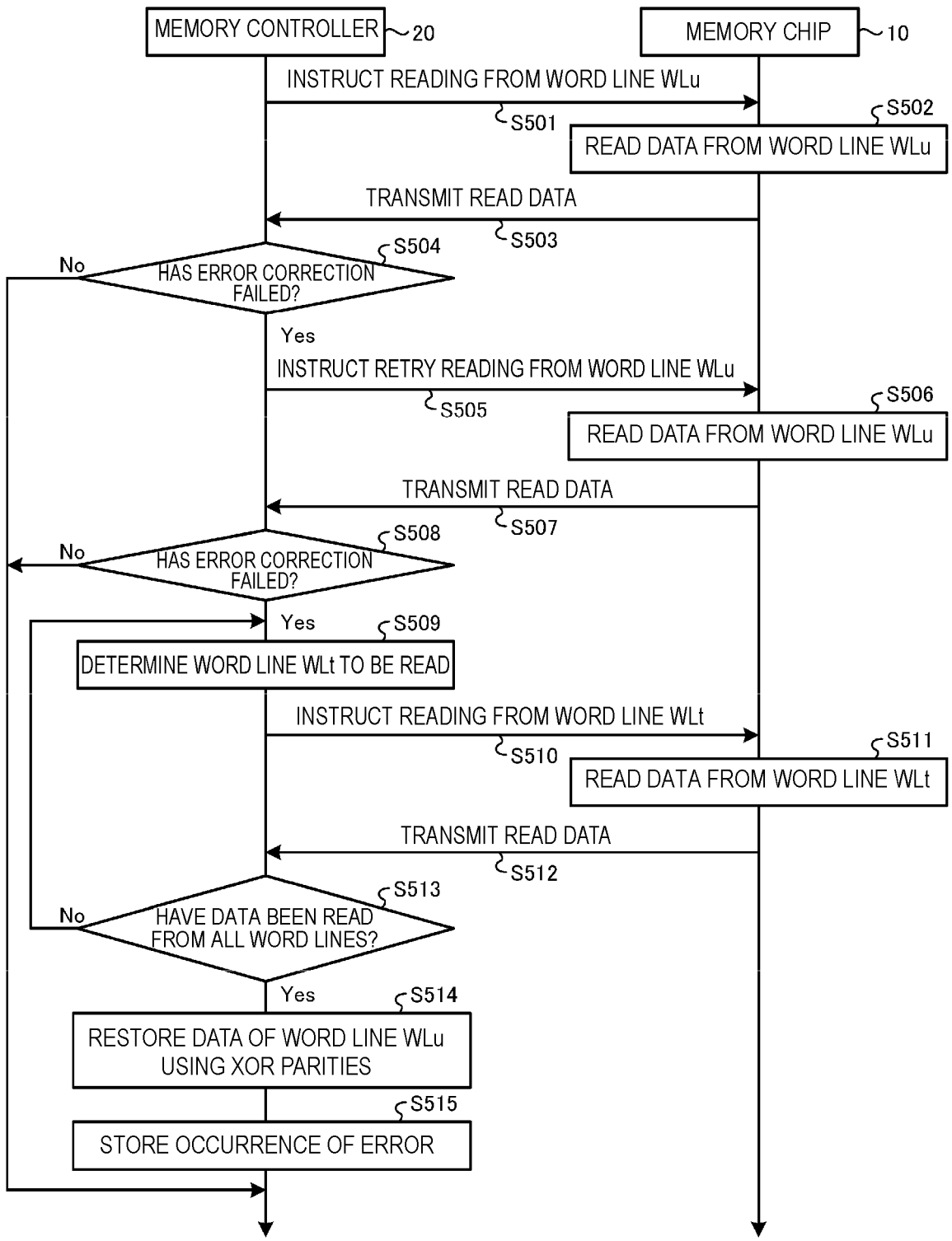
FIG. 15 depicts aspects related to a process sequence of a data reading process according to Modification 5.

In some instances, no error may occur at the time when data are written, but an error may occur at the time when data are read so that the data may not be read normally or correctly. In the present modification, descriptions will be made on a process of restoring data when an error occurs at the time when data are read. FIG. 15 is a sequence view illustrating an example of the data reading process in the present modification.

The memory controller 20 instructs to read data using a word line designated from, for example, the host device (hereinafter, referred to as a word line WLu) (step S501). According to the instruction, the memory chip 10 reads data using the word line WLu (step S502), and transmits the read data to the memory controller 20 (step S503).

The memory controller 20 (the ECC circuit 23) detects whether an error occurs in the read data, and executes an error correction when it is determined that an error occurs. The error correction corresponds to, for example, the error correction using component codes in a page as described above. The memory controller 20 determines whether the error correction has failed (step S504). When it is determined that the error correction has not failed (step S504: No), the reading process is ended.

When it is determined that the error correction has failed (step S504: Yes), the memory controller 20 reads the data by a retry reading. In the retry reading, various reading processes such as a shift read, a tracking read, and a soft bit read are performed. The shift read is a process of shifting a voltage (read voltage) applied to a word line, so as to perform the reading. The tracking read is a process of generating a histogram of distributions of threshold voltages (that is, threshold voltage distributions) programmed for multiple memory cells, by performing a reading multiple times while shifting the read voltage by a predetermined increment, and performing a reading using a read voltage corrected based on the generated threshold voltage distributions. A soft bit read is a process of reading data as information about a probability that each bit which makes up data to be read is 0 or 1.

When it is determined that the error correction has failed even though the retry reading was executed (step S508: Yes), the memory controller 20 executes the processes of steps S509 to S514 in order to restore the erroneous data.

First, the memory controller 20 determines a word line WLt to be read, from a block to be read (referred to as a block "a") (step S509). For the writing method that performs a writing from the drain side toward the source side, a word line to be read is determined in an order from the drain side toward the source side.

The memory controller 20 instructs the memory chip 10 to read data from the word line WLt of the block "a" (step S510). The memory chip 10 reads the data from the memory cell group connected to the word line WLt (step S511), and transmits the read data to the memory controller 20 (step S512).

The memory controller 20 determines whether data have been read from all of the word lines of the block "a" (step S513). The memory controller 20 determines that data have been read from all of the word lines, for example, when the reading of XOR parities from a dummy word line that corresponds to a dummy memory cell group has been ended.

When it is determined that data have not been read from all of the word lines (step S513: No), the process returns to step S509, and the process is repeated for the next word line. When it is determined that data have been read from all of the word lines (step S513: Yes), the memory controller 20 restores the data of the word line WLu by using the read data and the XOR parities (step S514).

The memory controller 20 stores information indicating the occurrence of an error in the block "a" (step S515). Similarly to Modification 4, the information indicating the occurrence of an error may be used for other data relieving processes such as a garbage collection, a refresh process or the like.

(Modification 6)

In the embodiments described above, XOR parities are stored in the dummy transistors by the SLC. From the viewpoint of ensuring the reliability or the like, when data may be stored by the MLC, TLC, and QLC, XOR parities may be stored by any one of the MLC, TLC, and QLC or a combination thereof. That is, the memory controller 20 may generate XOR parities by using data that correspond to a portion or all of multiple pages.

As described above, according to the embodiments described above, the error correction (coding) capability may be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system, comprising:
a nonvolatile memory including m planes each provided with n word lines (where n is an integer of 2 or more and m is an integer of 2 to n), n memory cell groups each including a plurality of memory cells, q dummy word lines (where q is an integer of 2 or more), and q dummy memory cell groups each including a plurality of memory cells, the nonvolatile memory being configured such that an x-th memory cell group (where x is an integer of 1 to n) that is connected to an x-th word line, a w-th dummy memory cell group (where w is an integer of 1 to q−1) that is connected to a w-th dummy word line, and in a z-th dummy memory cell group (where z is an integer of w+1 to q) that is connected to a z-th dummy word line are connected to each other in series; and a memory controller configured to generate 1-st to m-th parities using m combinations of 1-st to n-th data, respectively, wherein the memory controller is configured to:
- write i-th data (where i is an integer of 1 to n) to a memory cell group connected to an i-th word line of any of the m planes, such that k-th to (k+m−1)-th data (where k is an integer of 1 to n−m) are each written by a multiple bit level method to a plurality of memory cells in different planes, respectively, and
- write each of the 1-st to m-th parities by a single bit level method to any of the q dummy memory cell groups in any of the m planes, the nonvolatile memory further includes a (n+1)-th memory cell group that includes a plurality of memory cells, and the memory controller is configured to:
- store one-bit data in each of the memory cells in the (n+1)-th memory cell group to store the m pieces of 1-st to n-th data in the (n+1)-th memory cell group, and
- generate the 1-st to m-th parities by using the m pieces of 1-st to n-th data read from the (n+1)-th memory cell group,
- write a portion of the generated 1-st to m-th parities to 1-st to p-th dummy memory cell groups (where p is an integer of greater than 1 or more and less than q),
- write the m pieces of 1-st to n-th read data to the 1-st to n-th memory cell groups after writing to the 1-st to p-th dummy memory cell groups, and
- write the other parities of the 1-st to m-th generated parities to (p+1)-th to g-th dummy memory cell groups after writing to the 1-st to n-th memory cell groups, one memory cell in the p-th dummy memory cell group and one memory cell in the 1-st memory cell group are connected to each other in series, and one memory cell in the n-th memory cell group and one memory cell in the (p+1)-th dummy memory cell group are connected to each other in series.

2. The memory system according to claim 1, wherein each of the 1-st to n-th data includes a plurality of pages, and
the memory controller generates the 1-st to m-th parities by using data of a specific page in the plurality of pages.

3. The memory system according to claim 1, wherein each of the 1-st to n-th data includes a plurality of pages including a lower page, and
the memory controller generates the 1-st to m-th parities by using data of the lower page.

4. The memory system according to claim 1, wherein each of the 1-st to n-th data includes a plurality of pages, and
the memory controller generates the 1-st to m-th parities for each of the plurality of pages.

5. The memory system according to claim 1, wherein each of the 1-st to n-th data includes a plurality of pages, and
the memory controller generates the 1-st to m-th parities by using data of a portion or all of the plurality of pages.

6. The memory system according to claim 1, wherein the memory controller is configured to:
read any data of the 1-st to n-th data from the nonvolatile memory, and
when an error occurs in the reading of the data, restore the data that experienced the error during the reading using parities among the 1-st to m-th parities generated by using the data that experienced the error during the reading.

7. The memory system according to claim 1, wherein the nonvolatile memory includes a plurality of blocks that each includes 1-st to m-th planes, and
when an error occurs during a writing of data to a first block in the plurality of blocks, the memory controller changes the block to which the data are to be written from the first block to a second block in the plurality of blocks.

8. The memory system according to claim 1, wherein the nonvolatile memory includes a plurality of blocks that each includes 1-st to m-th planes, and
the memory controller writes the 1-st to m-th parities to the dummy memory cell groups without changing the block to which the data are to be written even if an error occurs during a writing of data to a first block in the plurality of blocks.

\* \* \* \* \*